United States Patent
Murgai

(10) Patent No.: US 9,465,165 B2
(45) Date of Patent: Oct. 11, 2016

(54) REFLECTION/ABSORPTION COATING FOR LASER SLABS

(71) Applicant: RAYTHEON COMPANY, Waltham, MA (US)

(72) Inventor: Vijay Murgai, Irvine, CA (US)

(73) Assignee: RAYTHEON COMPANY, Waltham, MA (US)

( * ) Notice: Subject to any disclaimer, the term of this patent is extended or adjusted under 35 U.S.C. 154(b) by 78 days.

(21) Appl. No.: 14/318,793

(22) Filed: Jun. 30, 2014

(65) Prior Publication Data

US 2015/0378093 A1    Dec. 31, 2015

(51) Int. Cl.
| | |
|---|---|
| G02B 6/036 | (2006.01) |
| G02B 6/132 | (2006.01) |
| H01S 5/024 | (2006.01) |
| H01S 5/20 | (2006.01) |
| G02B 6/12 | (2006.01) |

(52) U.S. Cl.
CPC ........... *G02B 6/132* (2013.01); *H01S 5/02469* (2013.01); *H01S 5/2022* (2013.01); *H01S 5/2027* (2013.01); *G02B 2006/12135* (2013.01)

(58) Field of Classification Search
None
See application file for complete search history.

(56) References Cited

U.S. PATENT DOCUMENTS

| | | | |
|---|---|---|---|
| 5,417,804 A * | 5/1995 | Nishihara | G02B 6/122 216/101 |
| 7,217,585 B1 | 5/2007 | Sumida et al. | |
| 2006/0251849 A1 | 11/2006 | Blauvelt et al. | |
| 2012/0081772 A1* | 4/2012 | Okazaki | G02F 1/3558 359/245 |
| 2014/0049984 A1* | 2/2014 | Chen | F21V 29/002 362/611 |
| 2014/0069622 A1* | 3/2014 | Chen | A61B 6/10 165/185 |
| 2014/0146477 A1 | 5/2014 | Youn | |

FOREIGN PATENT DOCUMENTS

| | | |
|---|---|---|
| CN | 200 993 717 Y | 12/2007 |
| WO | 9812583 A1 | 3/1998 |

OTHER PUBLICATIONS

Thielsch, et al., "A Comparative Study of the UV Optical and Structural Properties of SiO2, Al2O3, and HfO2 Single Layers Deposited by Reactive Evaporation, Ion-Assisted Deposition and Plasma Ion-Assisted Deposition", Thin Solid Films, vol. 410, No. 1-2, May 1, 2002, pp. 86-93.

* cited by examiner

*Primary Examiner* — Tina Wong
(74) *Attorney, Agent, or Firm* — Lando & Anastasi, LLP

(57) ABSTRACT

An optical waveguide for guiding electromagnetic waves. One example of an optical waveguide includes a waveguide substrate, at least one layer of low index optical coating formed on a surface of the waveguide substrate, and a thin layer of metal formed on a surface of the at least one layer of the low index optical coating, where the at least one layer of low index optical coating is disposed between the waveguide substrate and the thin layer of metal. The thin layer of metal can have a thickness in a range of about 5 nm to about 20 nm. In one example, the thin layer of metal is chromium.

18 Claims, 6 Drawing Sheets

REFLECTION/ABSORPTION COATING FOR LASER SLABS

BACKGROUND

An optical waveguide is a physical structure that guides electromagnetic waves in the optical spectrum and is considered one of the basic elements for confinement and transmission of light over various distances. These devices are commonly used in a wide number of technical areas, including integrated optical circuits, long distance light wave communication, and biomedical imaging.

One type of optical waveguide is constructed as a solid body that is capable of transmitting light, such as a laser beam, therethrough while confining the light beam to a specific region of the solid body. A planar waveguide, also known as a slab waveguide, confines the light beam to a planar region within the waveguide, thereby guiding light in only one dimension.

Conventional solid state optical waveguides consist of a core, in which light is confined, and a cladding or substrate surrounding the core. A guided wave propagates in the waveguide along its longitudinal direction. For example, a conventional slab waveguide may include three layers of materials. When light is injected from the side into the middle layer, light may be confined in the middle layer by reflection. This occurs when the refractive index of the middle layer is larger than that of the surrounding layers. A waveguide in which the index profile has abrupt changes between the core and cladding is called a step-index waveguide, while one in which the index profile varies gradually is called a graded-index waveguide.

Optical communications propagating in a planar waveguide may be amplified when the waveguide is used in combination with a pumping laser. The pumping laser stimulates electronic transitions which amplify the communications signal as it passes through the waveguide. In order to retain this energy within the waveguide, one or more additional layers of material may be added to the waveguide. This material should possess several characteristics, including the ability to absorb and reflect light back into the core and/or cladding. In addition, the material should possess good bonding and robust mechanical properties that allow it to interface with other materials and/or layers that construct the waveguide.

SUMMARY OF THE INVENTION

Aspects and embodiments are directed to an optical planar waveguide that incorporates a thin layer of metal. As discussed in more detail below, according to certain embodiments the thin layer of metal is chromium. The chromium is easy to deposit, adheres well to many other materials, and is mechanically robust. Aspects and embodiments may provide numerous benefits, including the ability of the chromium material to provide desired functional properties to the waveguide. For example, the inclusion of chromium imparts several desired optical properties to the waveguide. For instance, the chromium layer absorbs light well at one or more wavelengths, and exhibits low reflectance at certain angles of incidence, allowing light to more easily propagate through the waveguide. When used with a thermal optical interface, such as graphite, the thin layer of chromium is capable of reducing reflection at certain angles of incidence, even in the presence of air gaps that may be present between the graphite material and the chromium. This enables undesirable light to be absorbed by the chromium layer and graphite and also conducts away heat. Further, only a thin layer of chromium is required to achieve the desired optical properties, which reduces processing and material costs associated with the waveguide.

Some embodiments may benefit from some, none, or all of these features. Other benefits or technical advantages may be readily ascertained by one of ordinary skill in the art.

According to various aspects and embodiments, an optical waveguide is provided. The optical waveguide comprises a waveguide substrate, at least one layer of a low index optical coating formed on a surface of the waveguide substrate, and a thin layer of metal formed on a surface of the at least one layer of the low index optical coating, the at least one layer of the low index optical coating disposed between the waveguide substrate and the thin layer of metal.

In one example, the thin layer of metal has a thickness in a range of about 5 nm to about 20 nm. In another example, the thin layer of metal has a thickness of about 10 nm. In one example, the thin layer of metal is deposited onto the at least one layer of the low index optical coating. In one example, the thin layer of metal is chromium. The optical waveguide may further comprise a thermal optical interface in thermal communication with a surface of the thin layer of metal, and the thin layer of metal is disposed between the at least one layer of the low index optical coating and the thermal optical interface. In one example, the thermal optical interface is a layer of graphite. In one example, the thin layer of metal has an extinction coefficient of at least 3 at a wavelength of 1030 nm. In one example, the at least one layer of the low index optical coating is $Al_2O_3$ having a thickness of about 3000 nm. In one example, the waveguide substrate is a slab of yttrium aluminum garnet (YAG).

According to another embodiment, an optical waveguide apparatus is provided. The optical waveguide apparatus comprises an optical waveguide including: a waveguide substrate, a layer of low index optical coating formed on a surface of the waveguide substrate, and a thin layer of metal formed and on a surface of the layer of low index optical coating, the layer of low index optical coating disposed between the waveguide substrate and the thin layer of metal. The optical waveguide apparatus further comprises at least one light source disposed on a side surface of the optical waveguide and is configured to emit pump light into the waveguide in a direction of a length of the waveguide.

In one example, the at least one light source emits pump light at a wavelength in a range of about 1000 nm to about 1100 nm. In another example, the pump light is at a wavelength of about 1030 nm. In one example, the at least one light source is configured to emit the pump light at an angle of incidence on the waveguide of less than 70 degrees. In one example, the thin layer of metal has a reflectivity of less than 40%. In one example, the thin layer of metal has an extinction coefficient of at least 3. In one example, the thin layer of metal has a thickness in a range of about 5 nm to about 20 nm. In another example, the thin layer of metal has a thickness of about 10 nm. In one example, the thin layer of metal is chromium. In one example, the optical waveguide apparatus further comprises a thermal optical interface in thermal communication with a surface of the thin layer of metal, and the thin layer of metal is disposed between the at least one layer of the low index optical coating and the thermal optical interface.

Still other aspects, embodiments, and advantages of these example aspects and embodiments, are discussed in detail below. Moreover, it is to be understood that both the foregoing information and the following detailed description are merely illustrative examples of various aspects and embodiments, and are intended to provide an overview or framework for understanding the nature and character of the claimed aspects and embodiments. Embodiments disclosed herein may be combined with other embodiments, and references to "an embodiment," "an example," "some embodiments," "some examples," "an alternate embodiment," "various embodiments," "one embodiment," "at least one embodiment," "this and other embodiments" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

DETAILED DESCRIPTION

Figure 1:
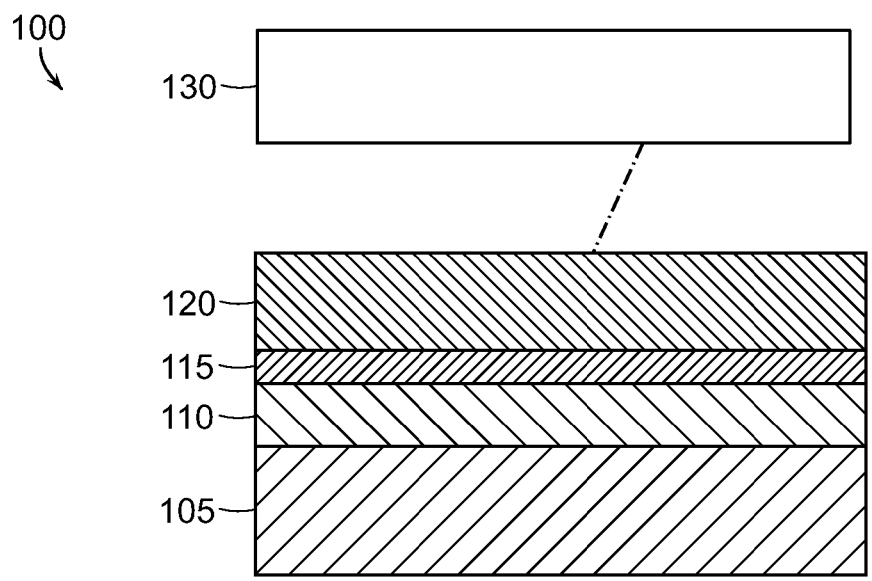
FIG. 1 is a side view of one example of an optical waveguide according to aspects of the invention.

Planar optical waveguides are often used to construct integrated optical circuits and semiconductor lasers. Rectangular waveguides may include one or more layers of material designed to confine a light beam coupled to the end face of the waveguide to one or more of these layers by reflection. This may be done by layering the materials based on one or more of their optical properties, such as the refractive index (n), which indicates the extent to which the material slows down light waves passing through the material, the extinction coefficient (k), which indicates the extent to which the material absorbs the light waves passing through the material, and the reflectivity or reflectance, which is the fraction of incident electromagnetic power that is reflected at an interface.

According to certain aspects, excess heat may be dissipated through the use of one or more coolers that are in thermal contact with the waveguide. The cooler may interact with the waveguide through a thermal optical interface (TOI), which contacts the exterior surface of the waveguide. One or more layers of material may be placed in between the TOI and the light propagating layers of the waveguide to allow parasitic and other undesirable emissions to escape from the waveguide to be absorbed by the TOI. Accordingly, one or more embodiments are directed to a waveguide that includes a layer of material with optical and mechanical properties that allow parasitic light to exit the waveguide and be absorbed by the TOI.

The aspects disclosed herein in accordance with the present invention are not limited in their application to the details of construction and the arrangement of components set forth in the following description or illustrated in the accompanying drawings. These aspects are capable of assuming other embodiments and of being practiced or of being carried out in various ways. Examples of specific implementations are provided herein for illustrative purposes only and are not intended to be limiting. In particular, acts, components, elements, and features discussed in connection with any one or more embodiments are not intended to be excluded from a similar role in any other embodiments.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated reference is supplementary to that of this document; for irreconcilable inconsistencies, the term usage in this document controls. Moreover, titles or subtitles may be used in the specification for the convenience of a reader, which shall have no influence on the scope of the present invention.

Aspects and embodiments disclosed herein relate to an optical waveguide. The optical waveguide may be a solid state planar, or slab, waveguide. Light transmitted through the waveguide is confined to a specific planar region of the solid body. According to some embodiments, the planar waveguide may function as an optical amplifier configured to operate in a range of wavelengths in the infrared (IR) region. For example, the optical waveguide may operate in the 1000-1100 nm wavelength range, including the 1030 nm wavelength. The systems disclosed herein are also capable of operating at other wavelengths, including the visible to near IR region of the electromagnetic spectrum, which includes wavelengths of 400-2000 nm. As an amplifier, the optical waveguide functions to amplify light, such as a laser, at a certain wavelength.

The optical waveguide may be pumped by pump lasers having various wavelengths. According to certain embodiments, the wavelength of the pumping laser is determined by the absorption wavelength(s) of material comprising the waveguide, which is shorter than the emitting wavelength. The angle of incidence for the pumping laser is selected according to the desired application and to considerations related to energy efficiencies. According to one or more embodiments, the pumping laser may be positioned from a side (edge) of the slab at an angle of incidence on the waveguide of less than 70 degrees. In various embodiments, the pumping laser is directed into waveguide material that is doped. According to other embodiments the pumping laser is directed into waveguide material that is undoped. For example, the pumping laser may be directed into doped YAG material, or alternatively, directed into undoped YAG material. In other examples, the pumping laser may be directed into doped sapphire material.

Referring to FIG. 1, there is illustrated an example of an optical waveguide, generally indicated at 100. In accordance with one or more embodiments, the optical waveguide 100 includes a waveguide substrate 105. In one or more embodiments, the waveguide substrate may be a single crystal substrate. In at least one embodiment, the waveguide substrate is yttrium aluminum garnet (YAG). According to one or more embodiments, the waveguide substrate may be any material that is capable of being doped and therefore able to absorb light from the pump laser and reemit this light. Further, the waveguide substrate may be any doped material capable of operating in the visible to near IR region of the electromagnetic spectrum, including wavelengths of 400-2000 nm. In certain embodiments, the waveguide substrate may have a refractive index in a range of about 1.5 to about 2.0. In other embodiments, the waveguide substrate may have a refractive index greater than 2.0. According to some embodiments, the waveguide substrate may comprise one or more layers of material. The thickness of the waveguide substrate may range from about 0.05 mm to about 2 mm, and the thickness is dependent on the design of the pumping laser. As recognized by those skilled in the pertinent art, the thickness of the waveguide substrate may be of any thickness to perform the various functions of the waveguide substrate as disclosed herein.

The optical waveguide 100 may further include one or more layers of a low index optical coating 110 disposed on a surface of the waveguide substrate 105. According to certain aspects, the low index optical coating 110 functions to create a waveguiding effect. In one or more embodiments, the low index optical coating 110 may be silica, alumina, or aluminum oxide ($Al_2O_3$), including non-crystalline $Al_2O_3$. The thickness of the layer of low index optical coating 110 may range from about 1000 nm to about 5000 nm. In at least one embodiment, the low index optical coating 110 has a thickness of 3000 nm. According to some embodiments, the low index optical coating 110 may have a refractive index that is lower than the waveguide substrate 105. For example, in at least one embodiment, the waveguide substrate 105 is a YAG material with a refractive index of 1.815 (at a wavelength of 1030 nm), and the low index optical coating 110 is a layer of $Al_2O_3$ with a refractive index of 1.755 (at a wavelength of 1030 nm). According to other embodiments, the low index optical coating 110 may have a refractive index less than 2.0, or less than 1.5. According to yet another example, the low index optical coating may have a refractive index in a range of about 1.5 to about 2.0.

The waveguide substrate 105 and the low index optical coating 110 may form a platform upon which other materials may be deposited, as discussed further below. The waveguide substrate 105 and the low index optical coating 110 may be formed by any one or more various well-known processes, such as chemical vapor deposition (CVD), ion assisted deposition, and sputtering. For example, the low index optical coating 110 may be deposited onto the waveguide substrate 105 under vacuum conditions using electron-beam deposition or sputter deposition methods.

Referring again to FIG. 1, in one or more embodiments a thin layer of metal 115 may be formed on a surface of the low index optical coating 110. The term "thin," when used herein to refer to the layer of metal 115, indicates a thickness in a range of about 5 nm to about 20 nm. For example, the thickness of the thin layer of metal 115 may be in a range of about 5 nm to about 10 nm. In at least one embodiment, the thickness of the thin layer of metal 115 may be about 10 nm. However, those skilled in the art will appreciate, given the benefit of this disclosure, that the thickness of the thin layer of metal 115 is not limited to the above examples, and may be of any thickness suitable for performing the functions discussed herein. The thin layer of metal 115 may be deposited using any one or more of a number of different, well-known methods, including sputtering, evaporation or chemical deposition techniques. According to some embodiments, the thin layer of metal 115 is configured to be attached to the low index optical coating 110 such that there are substantially no air gaps between the two layers of materials.

The thin layer of metal 115 may have one or more functional characteristics. For example, the thin layer of metal 115 may function as an optical isolator for preventing back-reflected signal amplification in the waveguide. Further, the thin layer of metal 115 may have one or more physical properties that contribute toward its functionality. For example, the thin layer of metal 115 may have a high extinction coefficient, k, which allows the metal material to absorb light energy propagating in the low index optical coating 110 and/or waveguide substrate 105. For example, in some embodiments, the thin layer of metal 115 has an extinction coefficient of at least 3 at a wavelength of 1030 nm. The thin layer of metal 115 may also have low reflectance. For example, at a wavelength of 1000 nm, the thin layer of metal 115 may have a reflectivity of less than about 40%. According to another example, the thin layer of metal 115 may have a reflectivity of less than 40% at angles of incidence on the waveguide that are less than 70 degrees. Further, according to various embodiments, the thin layer of metal 115 may adhere or otherwise bond well with other materials in the waveguide, such as the low index optical coating 110. For example, the thin layer of metal 115 may adhere to the low index optical coating 110 so that there are substantially no air gaps between the two layers of material. The thin layer of metal 115 may also possess a robust mechanical structure, making it less susceptible to mechanical damage. For instance, the thin layer of metal 115 may be a hard metal or alloy.

In at least one embodiment, the thin layer of metal 115 may be chromium. The chromium may be at least 10 nm thick and possess high absorption and low reflectance at low exit angles from the optical waveguide. As discussed further below, the chromium may possess reflective, absorptive, and bonding properties that enable it to enhance the performance of the optical waveguide.

According to certain aspects, as the power of the guided wave propagated in the optical waveguide is increased, the temperature of the optical waveguide is also increased. The optical waveguide 100 may therefore further include a thermal optical interface (TOI) 120 formed in or on the structure of the optical waveguide 100. For example, referring again to FIG. 1, the TOI 120 may be in thermal contact with a surface of the thin layer of metal 115. According to some examples, the TOI 120 may be in communication, such as through mechanical contact, with a surface of the thin layer of metal 115. The TOI 120 may also be in thermal contact with a cooler(s) 130 that is configured as an external structure to the optical waveguide, which is indicated in FIG. 1 by the dashed line between the TOI 120 and the cooler(s) 130.

According to certain aspects, the thin layer of metal 115 functions to minimize light at low angles of incidence from being reflected back into the waveguide. For example, the energy that is absorbed by the thin layer of metal 115 may be thermally conducted through the TOI 120 to the cooler 130 for removal. According to one embodiment, the TOI 120 may be a graphite material. The graphite material may include any one of a number of different materials containing carbon, such as fullerene, graphene, and carbon nanotubes. For example, graphite material may include eGRAF® HiTherm™ 1205 (available from GrafTech International Holdings Inc., Lakewood, Ohio).

Figure 2:
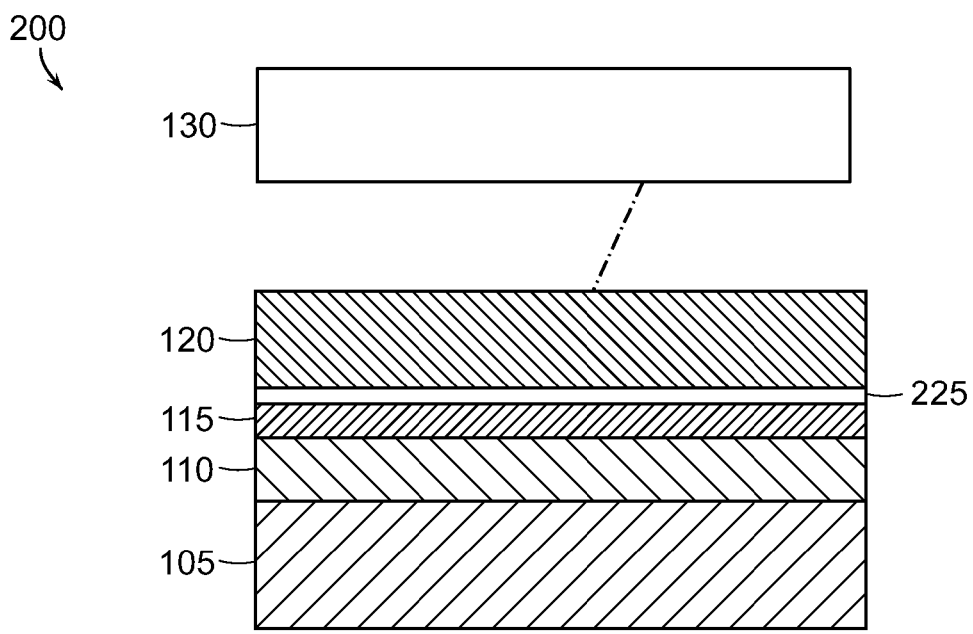
FIG. 2 is a side view of a second example of an optical waveguide according to aspects of the invention.

Referring now to FIG. 2, the use of a graphite material for the TOI 120 may lead to an air gap 225. FIG. 2 shows an optical waveguide, generally indicated at 200, with a waveguide substrate 105, a low index optical coating 100, and a thin layer of metal 115, as previously described above. The air gap 225 may make it impossible for the graphite material to make uniform contact with one or more exterior layers of material comprising the optical waveguide 200. In certain instances, the air gap 225 is inherent to the layer of graphite material used for the TOI, and therefore one or more air gaps 225 may be present in between the thin layer of metal 115 and the TOI 120. According to certain aspects, and as discussed further in the Examples below, the thin layer of metal 115 reduces reflection even with the presence of the air gap 225.

EXAMPLES

Figure 3:
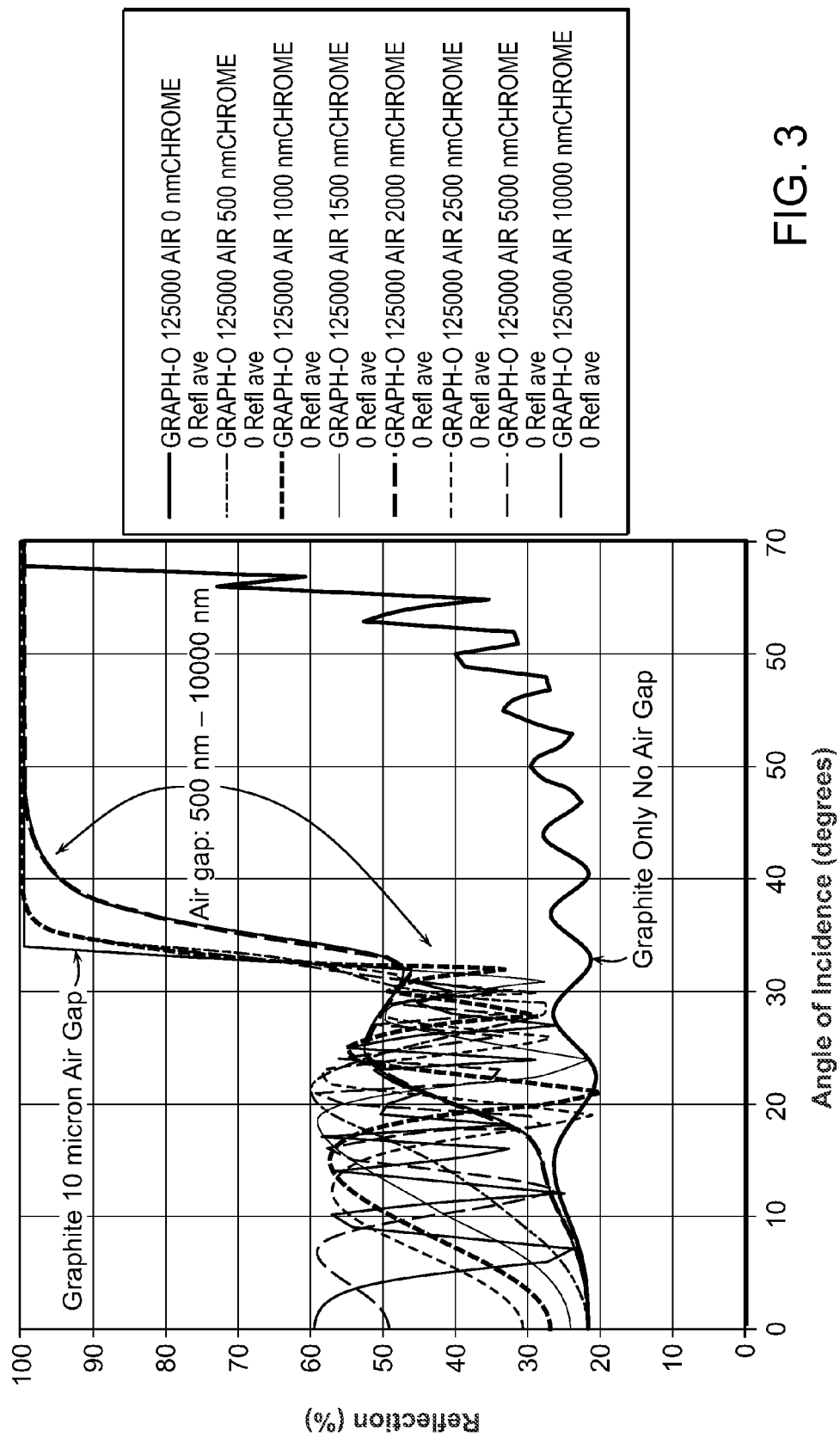
FIG. 3 is graph of reflectivity data for an experimental model waveguide in accordance to aspects of the invention.

Thin film modeling was performed using TFCalc™ 3.5.12 (available from Software Spectra, Inc., Portland, Oreg.) for a number of different waveguide structures. FIG. 3 is a graph illustrating the angle of incidence (x axis) versus the reflection (%) (y axis) for a waveguide that did not include a thin layer of metal. The wavelength used in FIGS. 3-7 was 1030 nm. The waveguide used in the modeling included YAG as the waveguide substrate, 3000 nm of $Al_2O_3$ as the layer of low index optical coating, and a 10 micron layer of graphite as the TOI. In a first scenario, an air gap was included in between the graphite and the $Al_2O_3$, with the thickness of the air gap ranging from 500 nm to 10,000 nm. In a second scenario, the air gap was omitted. The results shown in FIG. 3 indicate that the air gap featured in the first scenario caused reflection for angles of incidence between 33 and 68 degrees. Further, the air gaps also caused increases in reflection at other angles of incidence, including the peak at the 10 degree angle of incidence. The second scenario, without the air gap, indicated significantly less reflection.

Figure 4:
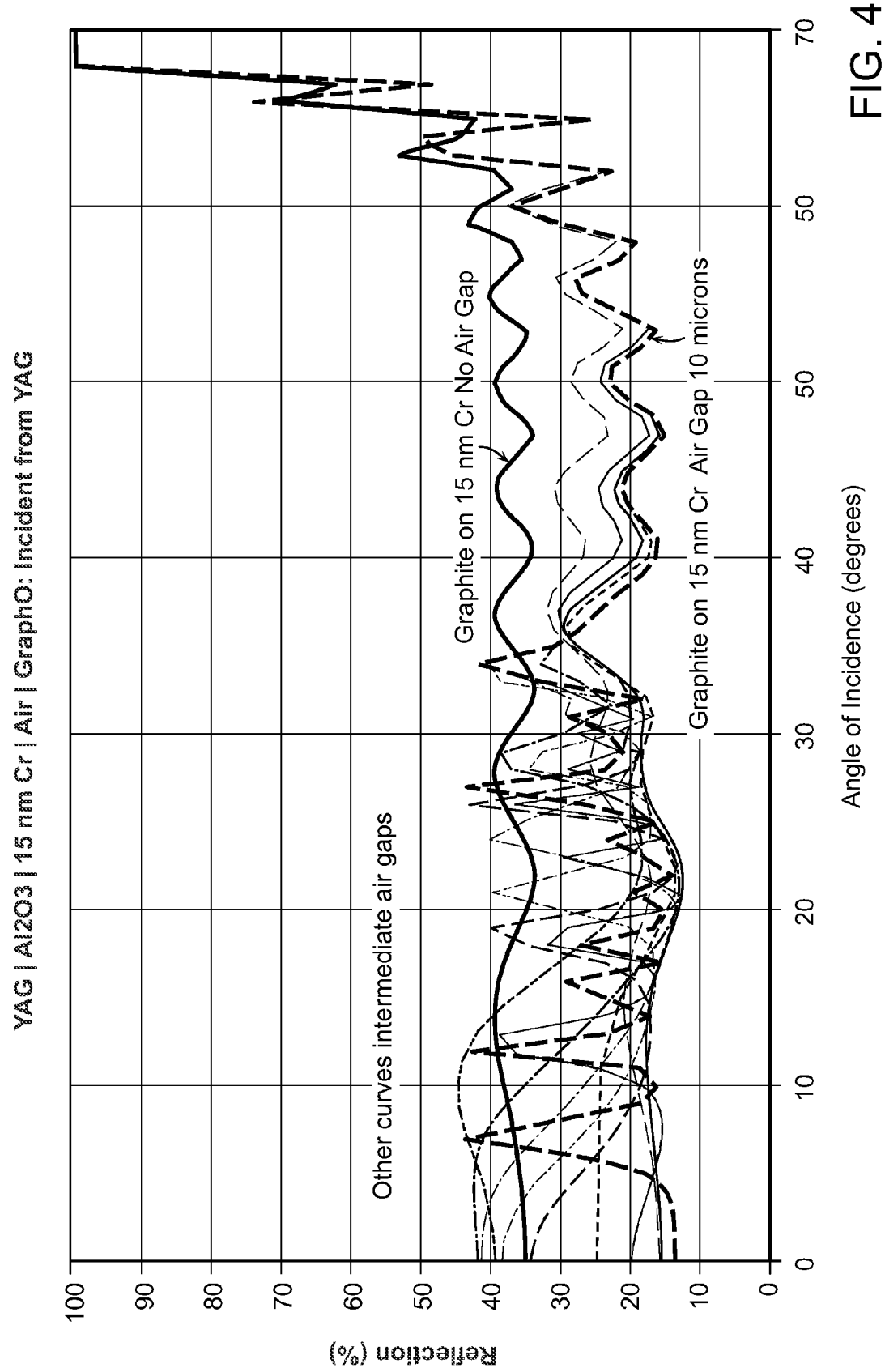
FIG. 4 is a graph of reflectivity data for a second experimental model waveguide in accordance to aspects of the invention.
Figure 5:
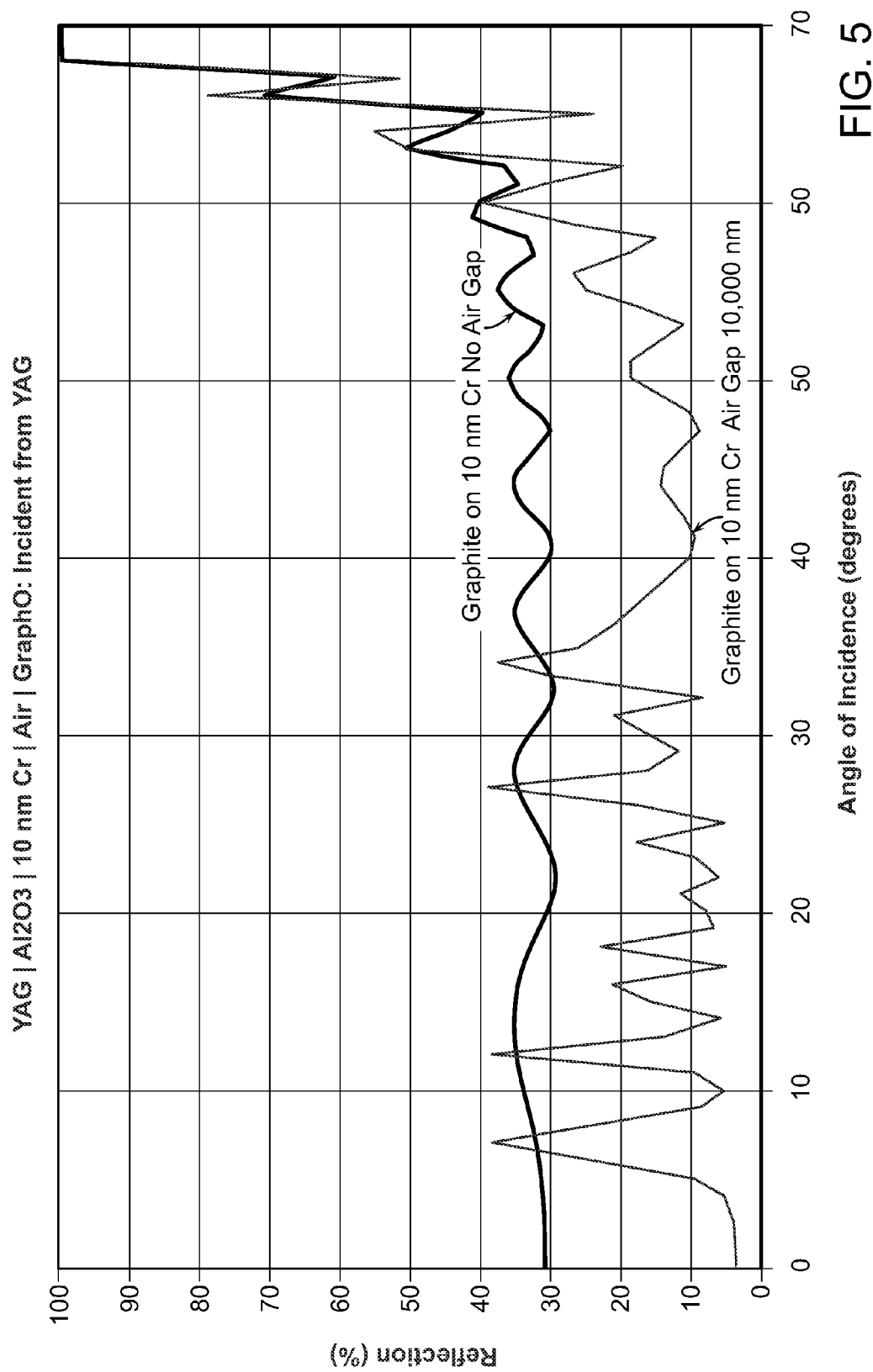
FIG. 5 is a graph of reflectivity data for a third experimental model waveguide in accordance to aspects of the invention.

FIG. 4 is a graph illustrating the same information as FIG. 3, but with a waveguide that includes the insertion of a 15 nm layer of chromium in between the layer of graphite and the $Al_2O_3$. The results indicated that even with an air gap thickness of 10 microns, the layer of chromium material was able to reduce reflection for angles of incidence between 33 and 68 degrees. FIG. 5 indicates similar results for the layer of chromium featured in FIG. 4, but in this example the chromium was modeled as being 10 nm thick and the air gap was 10,000 nm. Although this example included air gaps modeled at a thickness of 10,000 nm, similar results would be obtained using air gaps with other thicknesses, such as thicknesses less than 10,000 nm, or even one nm, since the presence of the air gap is what drives the results.

The results of the experimental modeling indicated that the use of chromium as an absorber layer reduced the reflection for angles of incidence between 33 and 68 degrees for any significant air gap that was present in the waveguide structure when using graphite as the TOI.

Figure 6:
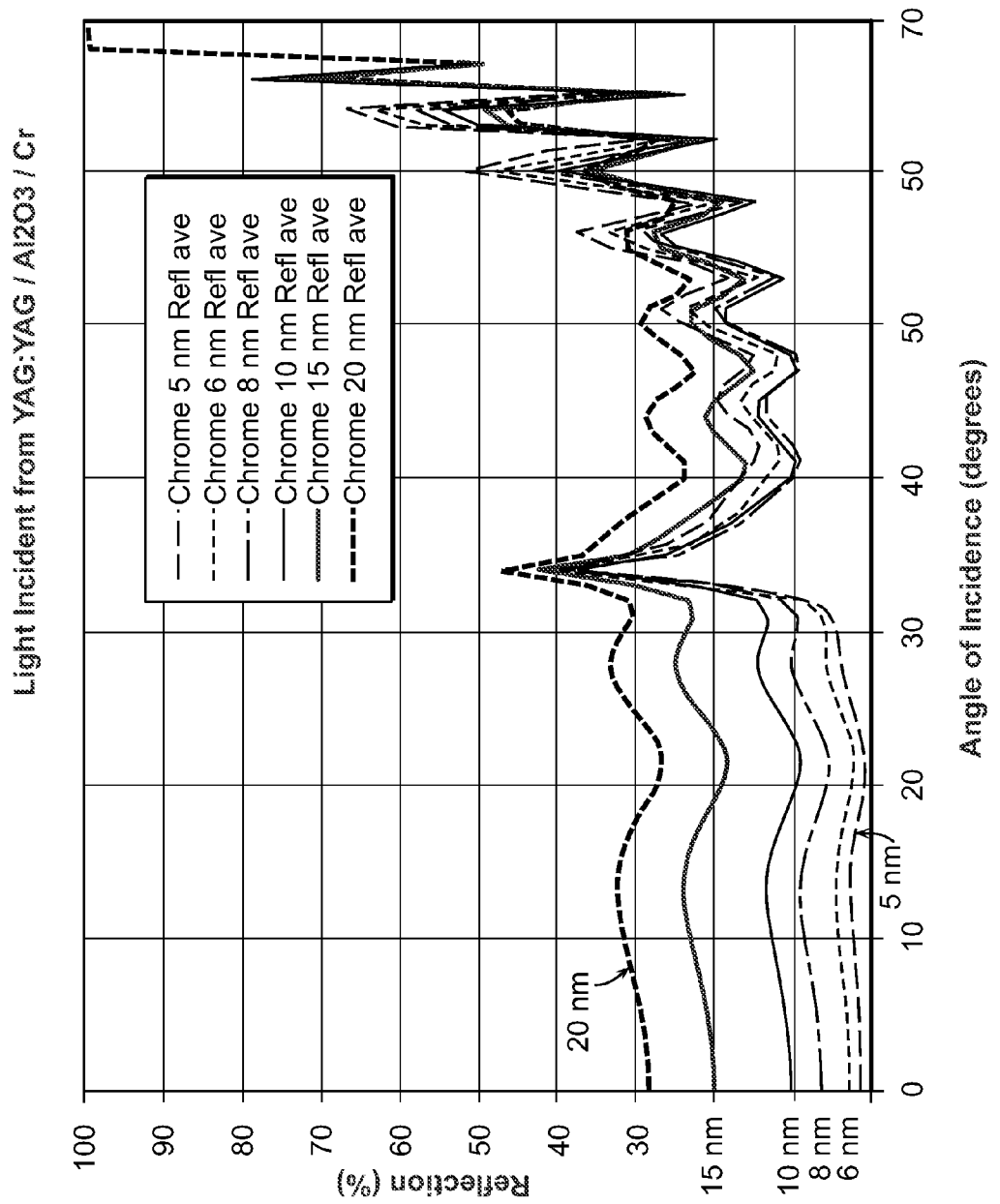
FIG. 6 is a graph of reflectivity data for a fourth experimental model waveguide in accordance to aspects of the invention.
Figure 7:
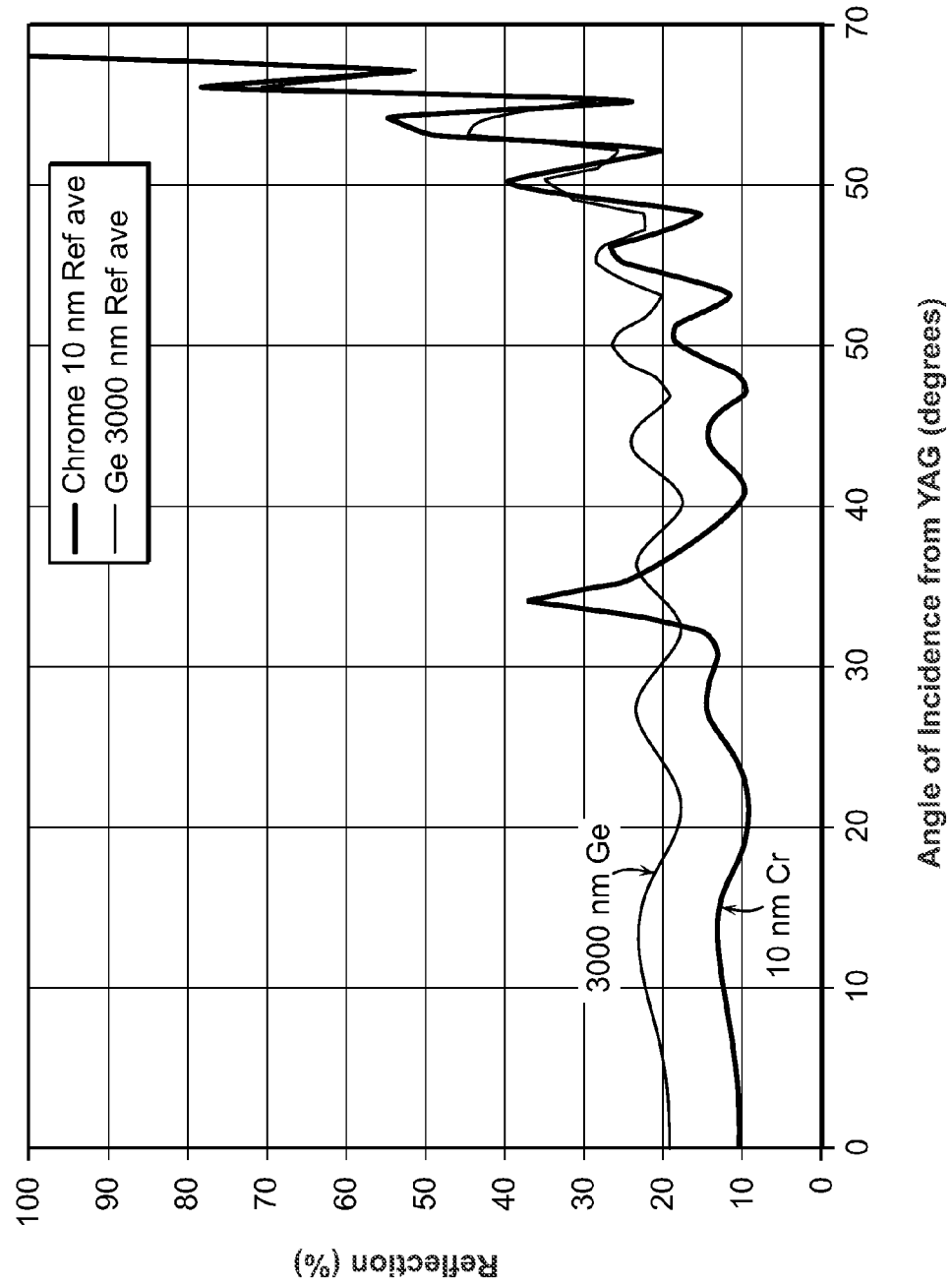
FIG. 7 is a graph of reflectivity data for a fifth experimental model waveguide in accordance to aspect of the invention.

In a further example, FIG. 6 is a graph illustrating the angle of incidence (x axis) versus the reflection (%) (y axis) of chromium at six different thicknesses that ranged from 5 nm to 20 nm for a waveguide that also included YAG and $Al_2O_3$ as the substrate and the low index optical coating materials, respectively. As shown, at angles of incidence between 30 degrees and about 68 degrees, the reflectivity of the chromium was below 40%. FIG. 7 is a graph illustrating the same waveguide with the 10 nm layer of chromium from FIG. 6. For purposes of comparison, FIG. 7 further includes the reflectivity data for a 3000 nm layer of germanium. Both FIGS. 6 and 7 were modeled using the same modeling software discussed above. This example illustrates that a much thinner layer of metal, such as chromium, can be used to achieve similar results in reflectivity. In certain instances, using a thinner layer of metal such as chromium can therefore have certain advantages, such as shorter processing times and lower processing costs.

Thus, aspects and embodiments provide a planar waveguide that incorporates a thin layer of metal, such as chromium. The chromium is easy to deposit, adheres well to other materials, including material used in the waveguide, and is mechanically robust, making it less susceptible to mechanical damage. The thin layer of chromium may provide one or more desired optical properties to the waveguide. For example, the thin layer of chromium layer is highly absorbing and exhibits low reflectance at angles of incidence on the waveguide of less than 70 degrees. This allows light to more easily propagate through the waveguide and allows undesirable light to be absorbed by the combination of the chromium and the thermal optical interface. In embodiments where the waveguide includes a thermal optical interface, such as graphite, which is in thermal contact with the layer of chromium, the chromium reduces reflection at angles of incidence on the waveguide of less than 70 degrees. This capability is preserved even in the presence of air gaps that may occur between the graphite material and the chromium, and therefore the presence of the chromium functions to keep light from penetrating through the graphite material. The mechanical properties of the chromium also allow it to interface well with the graphite material. Further, only a thin layer of chromium is required to achieve the desired optical properties, which reduces processing and material costs associated with the waveguide. For example, in some embodiments, the layer of chromium has a thickness of about 10 nm. This is much thinner than some conventional waveguides, which may include, for example, germanium, at thicknesses of 600 nm or more.

Having thus described several aspects of at least one embodiment, it is to be appreciated that various alterations, modifications, and improvements will readily occur to those skilled in the art. For instance, examples disclosed herein may also be used in other contexts. Such alterations, modifications, and improvements are intended to be part of this disclosure, and are intended to be within the scope of the examples discussed herein. Accordingly, the foregoing description and drawings are by way of example only.

What is claimed is:

1. An optical waveguide, comprising:
   a single crystal substrate;
   at least one layer of a low index optical coating formed on a surface of the single crystal substrate; and
   a thin layer of metal formed on a surface of the at least one layer of the low index optical coating, the thin layer of metal having a thickness in a range of about 5 nm to about 20 nm, and the at least one layer of the low index optical coating disposed between the single crystal substrate and the thin layer of metal.

2. The optical waveguide of claim 1, wherein the thin layer of metal has a thickness of about 10 nm.

3. The optical waveguide of claim 1, wherein the thin layer of metal is deposited onto the at least one layer of the low index optical coating.

4. The optical waveguide of claim 1, wherein the thin layer of metal is chromium.

5. The optical waveguide of claim 1, further comprising a thermal optical interface in thermal communication with a surface of the thin layer of metal, the thin layer of metal disposed between the at least one layer of the low index optical coating and the thermal optical interface.

6. The optical waveguide of claim 5, wherein the thermal optical interface is a layer of graphite.

7. The optical waveguide of claim 1, wherein the thin layer of metal has an extinction coefficient of at least 3 at a wavelength of 1030 nm.

8. The optical waveguide of claim 1, wherein the at least one layer of the low index optical coating is $Al_2O_3$ having a thickness of about 3000 nm.

9. The optical waveguide of claim 1, wherein the single crystal substrate is a slab of yttrium aluminum garnet (YAG).

10. An optical waveguide apparatus comprising:
    an optical waveguide including:
       a single crystal substrate;
       a layer of low index optical coating formed on a surface of the single crystal substrate; and
       a thin layer of metal formed and on a surface of the layer of low index optical coating, the thin layer of metal having a thickness in a range of about 5 nm to about 20 nm, and the layer of low index optical coating disposed between the single crystal substrate and the thin layer of metal; and
    at least one light source disposed on a side surface of the single crystal substrate and configured to emit pump light into the single crystal substrate in a direction of a length of the single crystal substrate.

11. The optical waveguide apparatus of claim 10, wherein the at least one light source emits pump light at a wavelength in a range of about 1000 nm to about 1100 nm.

12. The optical waveguide apparatus of claim 11, wherein pump light is at a wavelength of about 1030 nm.

13. The optical waveguide apparatus of claim 12, wherein the at least one light source is configured to emit the pump light at an angle of incidence on the side surface of the single crystal substrate of less than 70 degrees.

14. The optical waveguide apparatus of claim 13, wherein the thin layer of metal has a reflectivity of less than 40%.

15. The optical waveguide apparatus of claim 14, wherein the thin layer of metal has an extinction coefficient of at least 3.

16. The optical waveguide apparatus of claim 10, wherein the thin layer of metal has a thickness of about 10 nm.

17. The optical waveguide apparatus of claim 10, wherein the thin layer of metal is chromium.

18. The optical waveguide apparatus of claim 10, further comprising a thermal optical interface in thermal communication with a surface of the thin layer of metal, the thin layer of metal disposed between the at least one layer of the low index optical coating and the thermal optical interface.

* * * * *